(12) United States Patent  
Karg et al.

(10) Patent No.: US 8,053,037 B2
(45) Date of Patent: Nov. 8, 2011

(54) DEVICE AND METHOD FOR PATTERNING STRUCTURES ON A SUBSTRATE

(75) Inventors: Siegfried F. Karg, Adliswil (CH); Roland Germann, Wangen (CH); Heike E. Riel, Rueschlikon (CH); Walter Heinrich Riess, Thalwil (CH); Reto Schlittler, Schoenenberg (CH)

(73) Assignee: International Business Machines Corporation, Armonk, NY (US)

( * ) Notice: Subject to any disclaimer, the term of this patent is extended or adjusted under 35 U.S.C. 154(b) by 1158 days.

(21) Appl. No.: 10/595,434

(22) PCT Filed: Nov. 9, 2004

(86) PCT No.: PCT/IB2004/003696
§ 371 (c)(1),
(2), (4) Date: Apr. 19, 2006

(87) PCT Pub. No.: WO2005/047177
PCT Pub. Date: May 26, 2005

(65) Prior Publication Data
US 2009/0258166 A1    Oct. 15, 2009

(30) Foreign Application Priority Data
Nov. 12, 2003 (EP) .................... 03405806

(51) Int. Cl.
*C23C 8/00* (2006.01)
(52) U.S. Cl. ............... 427/585; 427/595; 427/248.1
(58) Field of Classification Search .......... None
See application file for complete search history.

(56) References Cited

U.S. PATENT DOCUMENTS

| 4,550,257 A | 10/1985 | Binnig et al. |
| 4,873,413 A * | 10/1989 | Uesugi et al. ............ 219/121.68 |
| 5,294,465 A | 3/1994 | Gallagher et al. |
| 2002/0063212 A1 * | 5/2002 | Mirkin et al. ................. 250/306 |

OTHER PUBLICATIONS

Jersch et al (Applied Physics A 64, 29-32 (1997)).*
Asahino et al (Physical Review Letters, vol. 86(2001), No. 19, pp. 4334-4337).*
Takahashi et al (Ultramicroscopy, vol. 82 (2000), pp. 63-68).*
Jersch (Applied Physics A 66, 29-34 (1998).*
Yau S T et al: "Laser-Assisted Deposition of Nanometer Structures Using a Scanning Tunneling Microscope" Applied Physics Letters, American Institute of Physics, New York, US, vol. 57, No. 27, Dec. 31, 1990, pp. 2913-2915 XP000222958 ISSN: 0003-6951 the whole document.

(Continued)

*Primary Examiner* — Michael Cleveland
*Assistant Examiner* — Joel Horning
(74) *Attorney, Agent, or Firm* — Yuanmin Cai

(57) ABSTRACT

A device for patterning structures on a substrate includes an imaging device having a scanning tip, a light emitting device, and a space around the scanning tip. The space comprises a vapor of a material which is suitable for Chemical Vapor Deposition onto the substrate when decomposed. The light emitting device is adapted to emit a light beam, which has an intensity not capable to decompose the vapor, onto the scanning tip in such a way that an electromagnetic field induced by the light beam near the scanning tip is high enough to decompose the vapor.

7 Claims, 3 Drawing Sheets

OTHER PUBLICATIONS

Shtokman M I: "Possibility of Laser Nanomodification of Surfaces by Means of a Scanning Tunneling Microscope" Optoelectron Instrum Data Process; Optoelectronics, Instrumentation and Data Processing (English Translation of Avtometriya) 1989, No. 3 1989 pp. 27-37, XP009043144 p. 27, paragraph 1 pp. 28-29 pp. 33-36.

Boneberg J, et al.: "Mechanism of Nanostructuring Upon Nanosecond Laser Irradiation of a STM Tip" Appl Phys A; Applied Physics A: Materials Science & Processing Oct. 1998 Springer-Verlag GMBH & Company KG, Berlin, Germany, vol. 67, No. 4, Oct. 1998, pp. 381-384, XP002315242 p. 381, right-hand column.

Nanostructuring with laser radiation in the nearfield of a tip from a scanning force microscope, Yau et al, Applied Physic Letters, vol. 164, No. 1 29032, Dec. 31, 1996.

Selective area oxidation of silicon with a scanning force mircoscope, H.C. Day, et al, Applied Physic Letters, vol. 62, 2691-2693, May 24, 1993.

Search report U.S. Appl. No. 10/595,434, for PCT/IB2004/003696 completed Jan. 27, 2005.

Yau S T et al: "Laser-Assisted Deposition of Nanometer Structures using a scanning tunneling microscope." Applied Physics Letter, American Institute of Physics, New York, US, vol. 57, No. 27, Dec. 31, 1990, pp. 2913-2915, XP00222958, ISSN: 0003-6951.

Shtokman M I: "Possibility of Laser Nanomodification of surfaces by means of a scanning tunneling microscope" Optoelectron Instrum Data Process; Optoelectron Instrum Data Process; Optoelectronics, Instrumentation and Data Processing, 1989, No. 3, 1989 pp. 27-37, XP009043144, p. 27, Paragraph 1, pp. 28-29, pp. 33-36.

Boneberg J et al: "Mechanism of nanostructuring upon nanosecond laser irradiation of a STM tip" Appl Phys A; Applied Physics A: Materials Science and Processing Oct. 1998, Springer-Verlag GMBH & Company KG, Berlin, Germany, vol. 67, No. 4, Oct. 1998, pp. 381-384, XP002315242, pp. 381, Right Hand Column.

\* cited by examiner

DEVICE AND METHOD FOR PATTERNING STRUCTURES ON A SUBSTRATE

CROSS-REFERENCE TO RELATED APPLICATIONS

The present application is a National Phase Application of PCT Application No. PCT/IB2004/003696 filed on Nov. 9, 2004, entitled "Device and method for patterning structures on a substrate", which in turn claims priority of European Patent Application No. 03405806.5, filed on Nov. 12, 2003, entitled "Device and method for patterning structures on a substrate". The content of above applications are incorporated herein by reference in their entirety.

FIELD OF THE INVENTION

The present invention relates to the manufacture of semiconductor devices. In particular, it relates to device and method of patterning structures on a substrate.

BACKGROUND OF THE INVENTION

Usually substrates are patterned by the use of lithography. Using this technique the smallest patterns that can be produced are restricted by the resolution of the lithography, namely the wavelength of light emitted by a light source used and the smallest dimensions of the patterning of the photoresist used in the lithography. The smallest dimensions which can be produced by the known 157 nm lithography technology are about 50 nm. However, the effort for achieving this dimension is enormous and thus is only payable when used in patterning substrates in rather big quantities.

Due to this reason, patterning of structures of dimensions less than 100 nm is conventionally achieved with e-beam lithography or focused electron or ion beam technique, since light sources, which can produce light with a wavelength of less than 100 nm, and corresponding photoresists are not available right now. Focused electron beams (FEBs), focused ion beams (FIBs) as well as laser beams and scanning tunneling microscope (STM) probes offer unique advantages over classical resist based processes. Among these are in situ depositions of metals or dielectrics as well as selective etching. Usually, a substrate on which the structures shall be patterned is scanned with an STM and then the substrate is targeted with a focused electron beam or ion beam. All techniques, except laser beams, have resolution capable for nm-sized deposition, i.e. nm-sized dimensions of the produced structures.

The FEB and FIB are usually very expensive. The basic process employed in all the above mentioned techniques is a local Chemical Vapour Deposition (CVD) process at the position of the beam, although the decomposition of the vapour varies strongly with the nature of the input energy. Beside the high costs, a further drawback of the depicted methods is that the substrate has to be conductive or at least some portions of the substrate have to be conductive so that it is possible to start the patterning of the substrate when an STM is used. This imposes a great restriction onto the substrates that can be used.

Another drawback of the above-mentioned approach is that, while scanning the substrate is performed with a low current density, high current densities have to be applied in order to produce an electron or ion beam. Therefore, it is only possible to operate the patterning process in a switching manner, i.e. at one time the scanning is performed with a low current density and at another time the electron beam or ion beam is generated for patterning the substrate. This leads to the problem that after the substrate is scanned, the scanned areas to be patterned have to be found again.

Further, the generation of the electron beam or ion beam is performed in a pulsed operation, since with usually used STMs the necessary high current densities are not achievable in a constant operation. Furthermore, due to the pulsed operation with the high current densities the tip of the microscope wears out quickly.

An alternative technique to define structures in dimensions less than 100 nm is a so-called nanostencil approach. According to this approach, an aperture in a cantilever of an Atomic Force Microscope (AFM) tip is used as a stencil mask in conjunction with a Physical Vapour Deposition (PVD) process. A drawback of this approach is the usage of the PVD that only has a limited operational possibility.

Another method for exposing a photoresist is the usage of a metalized tip of an AFM to enhance the electromagnetic field. According to this method an external light source is used to illuminate a metalized tip with a low intensity UV-light that is not capable to cause photo-conversion. The low intensity UV-light is then enhanced via plasmon resonance to an electromagnetic field of an intensity that is high enough to cause the photo-conversion. Only in the close proximity of the AFM tip the intensity is high enough to convert the photoresist.

SUMMARY OF INVENTION

It is an object of the present invention to overcome at least some of the disadvantages of conventional systems and methods and to define patterns of complex shape in close proximity to each other where devices and the methods according to embodiments of the invention are capable of defining patterns with sub 100 nm dimensions.

The present invention is directed to a device for patterning structures on a substrate. The device comprises an imaging device such as, for example, an Atomic Force Microscope, having a scanning tip, a light emitting device, and a space around the tip. The space comprises a vapour of a material which is suitable for Chemical Vapour Deposition onto the substrate when decomposed, and the laser device is adapted to emit a laser beam, which has an intensity that is not capable to decompose the vapour, onto the tip in such a way that an electromagnetic field induced by the laser beam near the tip is high enough to decompose the vapour. A holder might be provided for carrying the substrate.

In another aspect of the present invention a method for patterning structures on a substrate by a device including an imaging device and a light emitting device is provided. The method includes the steps of providing the substrate underneath a tip of the microscope, preferably on a holder of the microscope; providing a vapour of a material, which is suitable for Chemical Vapour Deposition onto the substrate when decomposed, in a space between the tip and the substrate; and exposing the tip to a laser beam emitted by the laser device, wherein an intensity of the laser beam is not enough to decompose the vapour, in such a way that the an electromagnetic field intensifies near the tip to such an extend that the vapour is decomposed.

A unique feature of the present invention is that a light beam is used to produce structures with dimensions in the order of a few nanometers. The weak light beam is emitted from a light emitting device onto a scanning tip of an imaging device from which the weak light beam is amplified to such an extend that the electromagnetic near-field around the scanning tip is strong enough to decompose the vapour. After decomposition of the vapour or gas near the scanning tip of the imaging device a component of the vapour is deposited onto the substrate. Thus, according to the present invention a movement of the scanning tip of the imaging device can produce nanostructures in dimensions of a few nanometers onto the substrate, e.g. lines of conductive materials can be deposited onto the substrate.

According to the present invention it is possible to use non conductive substrates, since light and a scanning tip of an imaging device is used instead of the usage of an electrical potential which is applied to a microscope tip, i.e. the use of electron or ion beams as known in the prior art.

A further advantage is that the operation of the method according to the present invention does not have to be performed in a switching manner, but it is possible to scan and pattern the substrate at the same time. This is in particular advantageous since according to the present invention it is now possible to find the patterned structures, e.g. conductive lines, in an easy way.

Furthermore, according to the present invention it is possible to use Chemical Vapour Deposition (CVD) instead of Physical Vapour Deposition (PVD) and thus it is possible to deposit a much wider range of particles compared with that possible with PVD.

The present invention relies on the chemical reaction of a vapour only in the near field of the scanning tip, since the scanning tip enhances the low intensity light field that is emitted from a light emitting device onto the scanning tip of the imaging device. This near electromagnetic field about the scanning tip enhances the temperature in close proximity to the scanning tip easily to such an extend that the vapour is decomposed. This decomposition only in the close proximity to the scanning tip results in a deposition of a component of the decomposed vapour only in close proximity to the scanning tip. The resolution of the deposition is limited by the thermal conductivity of the substrate, the sharpness of the decomposition threshold, i.e. how sharp are the limits of the range in which the vapour decomposes, and the wavelength of the incident light.

Due to the fact that according to the present invention no high current densities are necessary, the deposition of the decomposed vapour can be performed in a continuous operation mode and not in a pulsed operation mode as it is performed according to the prior art. Thus, the method according to the present invention leads to a smaller wear of the scanning tip of the imaging device.

Further preferred embodiments are disclosed in the dependent claims. The embodiments are described in conjunction with the device according to the present invention but relate analogues to the method according to the present invention.

In one embodiment the light emitting device is a laser.

In another embodiment the imaging device is an Atomic Force Microscope or a Scanning Tunneling Microscope.

By using an Atomic Force Microscope (AFM) or a Scanning Tunneling Microscope (STM) which generally have microscope tips with diameters of about 5 nm to 20 nm an easy way can be provided to achieve resolutions of the scanning and patterning of the substrate which are in the sub-lithography range of a few nanometers, e.g. up to 5 nm.

In a further embodiment the laser device is adapted to emit the laser beam onto the tip in such a way that the polarization is parallel to a longitudinal axis of the tip.

By aligning the polarization of the laser beam and the tip of the microscope in such a way it is possible to increase the strength of the near electromagnetic field around the tip in an efficient way.

In another embodiment the tip has a dimension between 5 nm and 20 nm at maximum.

With a tip of such a dimension, i.e. 5 nm, for example, it is possible to form structures on the substrate which are of the same dimension, i.e. sub-lithographic structures, when a distance between the tip and the substrate is in the range of about 5 nm to 10 nm. Such dimensions are suitable for molecular scale electronic.

In yet another embodiment the device comprises a plurality of substantially parallel tips.

By the use of a plurality of parallel tips it is possible to form a plurality of parallel structures on the substrate at the same time, i.e. in one single step. Thus, complex structures on a substrate can be formed in an easier and faster way. For example a plurality of several parallel conductive lines can be formed on the substrate.

In yet another embodiment the wavelength of the laser beam is adapted to match the size of the tip so that a sufficient amplification of the emitted laser beam is achieved.

By adapting the size of the tip to the wavelength of the laser a stationary wave can be generated in the longitudinal direction of the tip. Thus, a more efficient amplification of the primary intensity of the electromagnetic field of the laser beam can be provided.

In yet another embodiment the tip of the microscope is metalized.

In another embodiment the vapour is a gas selected from the group consisting of Halides, Hydrides, metal organic compounds, $AuClPF_3$, $W(CO)_6$, $TiCl_4$, $TaCl_5$, $WF_6$, $SiH_4$, $GeH_4$, $AlH_3(NMe_3)_2$, $NH_3$, $AlMe_3$, $Ti(CH_2tBu)_4$, $Ti(OiPr)_4$, $Ti(NMe_2)_4$, $Cu(acac)_2$, and $Ni(CO)_4$.

Possible metal organic compounds may be Metal Alkyls, Metal Alkoxides, Metal Dialylamides, Metal Diketonates, and Metal Cabonyls.

These gases are suitable for Chemical Vapour Deposition and thus the structures on the substrate can be easily formed by using these gases in a device according to the present invention. Materials which can be used for the structures, e.g. metal lines, on the substrate are gold, tungsten, aluminum, alkaline earth, Ca or Mg.

One aspect of the invention can be seen in using an imaging device, e.g. a microscope and in particular an Atomic Force Microscope (AFM), together with a weak light beam, in particular a laser beam for forming sub-lithographic structures on a substrate. A weak laser beam of a laser device is emitted onto a scanning tip of the AFM, i.e. the microscope tip. Usually microscope tips having a diameter between 5 nm and 20 nm. However, according to the present invention the diameter of the microscope tip is not restricted to this range and other sizes may be used. A weak laser beam in this context means that the intensity of the electromagnetic field of the laser beam is not high enough to decompose a gas which is suitable for Chemical Vapour Deposition (CVD) when decomposed. Instead of an AFM, a Scanning Tunnel Microscope (STM) can be used as well. By projecting the weak laser beam onto the tip of the AFM an electromagnetic field in the near field around the tip is amplified to such an extent that a provided gas, which is suitable for CVD is decomposed and a component of the decomposed gas is deposited onto the substrate. According to the present invention, different CVD techniques can be used, such as Atmospheric Pressure Chemical Vapour Deposition (APCVD), Low Pressure Chemical Vapour Deposition (LPCVD), Plasma Enhanced Chemical Vapour Deposition (PECVD), Metal-Organic Chemical Vapour Deposition (MOCVD), Laser Chemical Vapour Deposition (LPCVD), and/or Photochemical Vapour Deposition (PCVD).

BRIEF DESCRIPTION OF THE DRAWINGS

In the following the invention is explained more fully with reference to embodiments represented by the accompanying drawings of which.

DETAILED DESCRIPTION OF PREFERRED EMBODIMENTS

Figure 1:
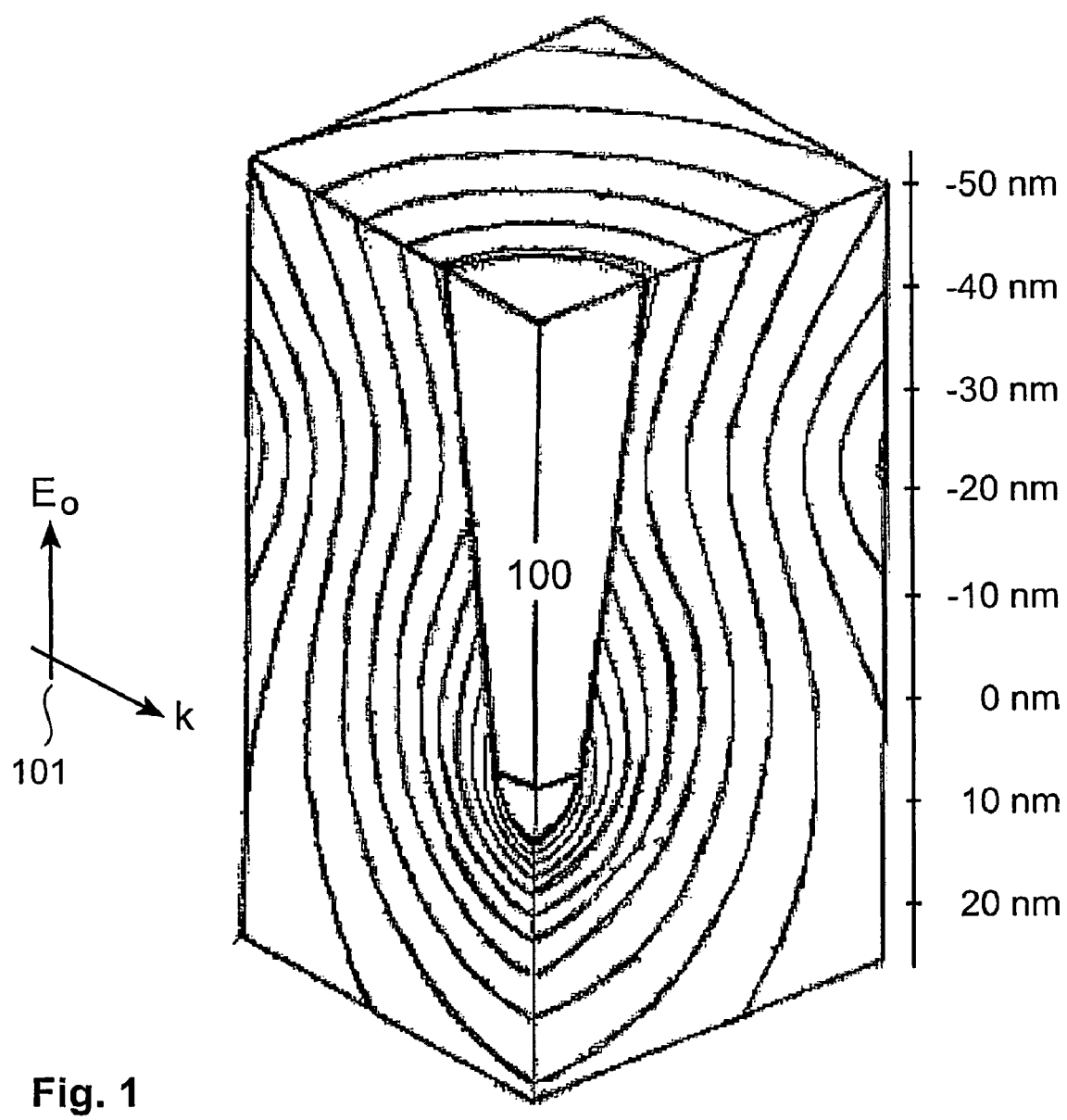
FIG. 1 shows a field distribution around a tip of an Atomic Force Microscope.

FIG. 1 shows the field distribution of an electromagnetic field around a tip 100 of an Atomic Force Microscope (AFM). The depicted electromagnetic field is the result of a three-dimensional multiple method simulation. Shown in FIG. 1 is a quadrant of the tip 100 and the surrounding near field, which tip 100 is cut along its longitudinal axis. The tip 100 was illuminated by a monochromatic laser beam with a wavelength of 810 nm, e.g. a sapphire laser. Further, the direction and the polarization of the incident laser beam, i.e. the E and k vectors of the wave, are indicated by the coordinate system 101 in FIG. 1. In the simulation a gold tip having a radius of 5 nm is used, which tip is illuminated from the side. Furthermore, a polarization of the laser beam is parallel to the tip axis, i.e. the E vector of the laser beam is parallel to the tip axis.

In FIG. 1 the field distribution is shown by contours of $E^2$ of the electromagnetic field around the tip. In the shown contour plot the difference between two successive lines is a factor of two which means that the intensity of the electromagnetic field increases by the factor of two from one contour line to the next contour line when approaching the tip. For illustrating the dimensions, a scale is given at the right. The total height of the tip and the surrounding electromagnetic field shown in FIG. 1 represents a height of about 75 nm. The simulation shows that an intensity enhancement of the electromagnetic field at the foremost part of the tip is about 3,000 times stronger than the illuminating intensity of the laser beam. Furthermore, it arises from the simulation that the electromagnetic field is almost rotationally symmetric in the vicinity of the tip.

The shown results of the simulation illustrate that it is possible to enhance the strength of a weak electromagnetic field, e.g. the field of a laser beam, by illuminating a tip of an AFM.

Figure 2:
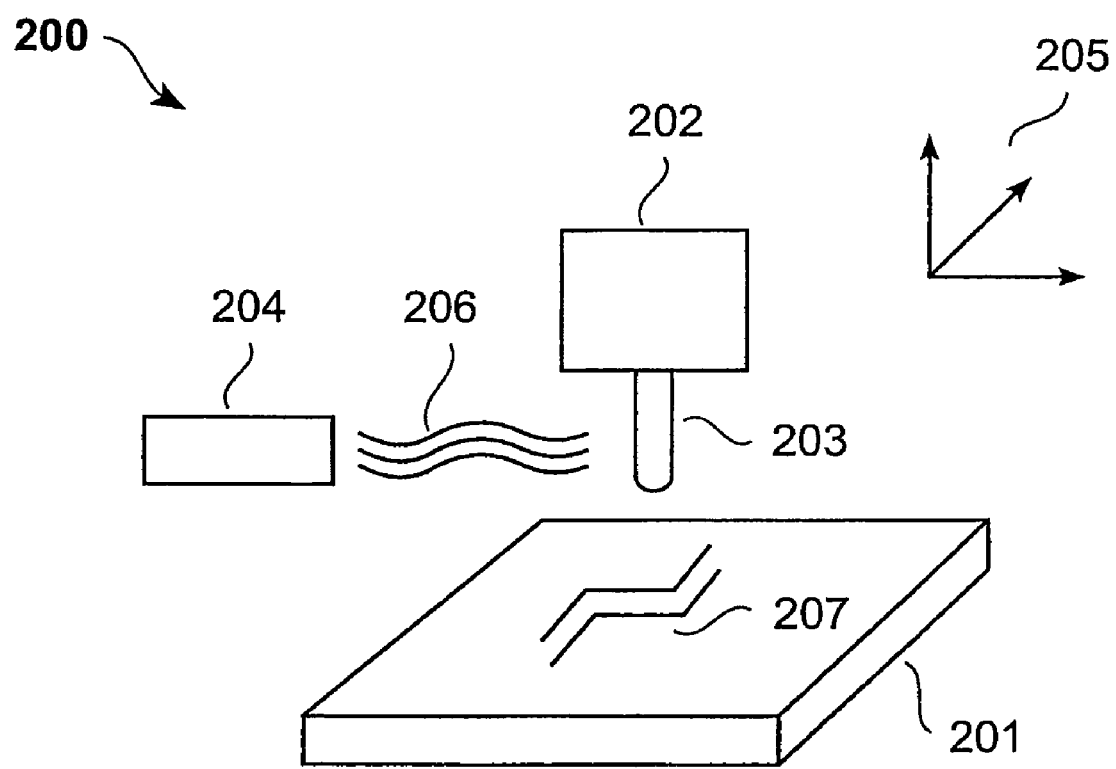
FIG. 2 shows a device for patterning structures on a substrate according to an embodiment of the present invention.

In FIG. 2 a schematic illustration of a device 200 according to an embodiment of the present invention is shown, which device is suitable for patterning structures, e.g. for depositing conductive lines, with small dimensions onto a substrate 201. The device comprises an AFM 202, which is only schematically shown. The AFM 202 comprises a metalized tip 203. In the embodiment the tip 203 is a gold tip having a diameter of 5 nm, but the tip 203 can be made of every other material suitable for AFM tips. Underneath the tip 203 a substrate 201 may be arranged on which conductive lines should be formed. Further, the device 200 comprises a laser 204 which may illuminate the tip 203 with a laser beam of a low intensity, i.e. an intensity that is not high enough to decompose a vapour or gas that is introduced between the tip 203 and the substrate 201. The AFM 202 and thus the tip 203 of the AFM and/or the substrate 201 may be three-dimensionally moved as is indicated by the coordinate system 205 shown in FIG. 2.

For the patterning of the substrate 201, the above-mentioned device 200 may be inserted into a common Chemical Vapour Deposition apparatus (CVD apparatus). Such a CVD apparatus usually include, for example, a reactor chamber within which deposition takes place, a gas delivery system for supplying precursors such as gases suitable for CVD into the reaction chamber, a substrate loading mechanism which is used for introducing and removing substrates and mandrels etc., an energy source providing the energy/heat that is required to get the precursors to react and/or decompose, a vacuum system for removal of gaseous species other than those required for the reaction/decomposition, an exhaust system for removal of volatile by-products from the reaction chamber, an exhaust treatment system in case that some of the exhaust gases are not suitable for being released into the atmosphere and require treatment or conversion into safe/harmless compounds, and process control equipment such as gauges, controls, alarm and safety devices etc. to monitor process parameters such as pressure, temperature and time. For clarity reasons such a well known CVD apparatus is not depicted in FIG. 2. Gases that are suitable for CVD, i.e. typical precursor materials, generally fall into a number of categories such as, for example:

Halides such as $TiCl_4$, $TaCl_5$, $WF_6$;
Hydrides such as $SiH_4$, $GeH_4$, $AlH_3(NMe_3)_2$, $NH_3$;
Metal Organic Compounds;
Metal Alkyls such as $AlMe_3$, $Ti(CH_2tBu)_4$;
Metal Alkoxides such as $Ti(OiPr)_4$;
Metal Dialylamides such as $Ti(NMe_2)_4$;
Metal Diketonates such as $Cu(acac)_2$;
Metal Cabonyls such as $Ni(CO)_4$.

For patterning the substrate 201a laser beam 206 is emitted by the laser 204 which illuminates the tip 203 while a gas or a vapour suitable for CVD is introduced into a space between the tip 203 and the substrate 201. In the embodiment of FIG. 2, $AuClPF_3$, for example, is used as the gas introduced into the space between the tip 203 and the substrate 201. The threshold temperature for decomposition of $AuClPF_3$ is about 150° Celsius. As the laser device 204, i.e. laser source, a weak infrared source can be used, such as a sapphire laser emitting light having a wavelength of 810 nm. As already mentioned the intensity, i.e. energy, of said laser beam 206, i.e. primary laser beam, is not high enough to decompose the gas or vapour so that no deposition of a metal line, i.e. a conductor line, would be possible by using this primary laser beam.

But as mentioned with reference to FIG. 1 the electromagnetic field of the primary laser beam 206 is amplified by the tip 203 of the AFM 202 so that the intensity, i.e. energy, of the electromagnetic near field in the close vicinity of the tip 203 is high enough to decompose said gas or vapour so that a CVD can be accomplish forming a line 207 onto the substrate 201. That is the temperature in close vicinity to the tip is increased above 150° Celsius and thus the $AuClPF_3$ is decomposed. This results in the deposition of gold on the substrate, while the AFM tip is scanning the substrate. Since the electromagnetic field is only strong enough to decompose the vapour in close vicinity of the tip 203 a metal line 207 having very small dimensions may be formed on the substrate 201. By using a tip 203 having a diameter of 5 nm, lines 207 having the same dimension, i.e. a dimension of 5 nm, may be formed on the substrate 201. To achieve this dimension a typical distance between the tip 203 and the substrate 201 is in the range of 5 to 10 nm. However, other distance range may be used.

Since the decomposition of the vapour is concentrated in the very close vicinity of the tip 203 the metal line 207 is substantially formed underneath the tip 203. Thus, it is possible to achieve metal lines 207 having a desired arrangement on the substrate 201 by moving the AFM tip 203 and the substrate relative to each other corresponding to the desired arrangement. In a descriptive way it can be said that the tip 203 "writes" the metal lines 207 onto the substrate. The metal lines 207 will take part in every turnaround of the tip 203 leading to an easy way for patterning the substrate 201, since the electromagnetic field is only strong enough to decompose the vapour in the close vicinity of the tip 203.

Figure 3:
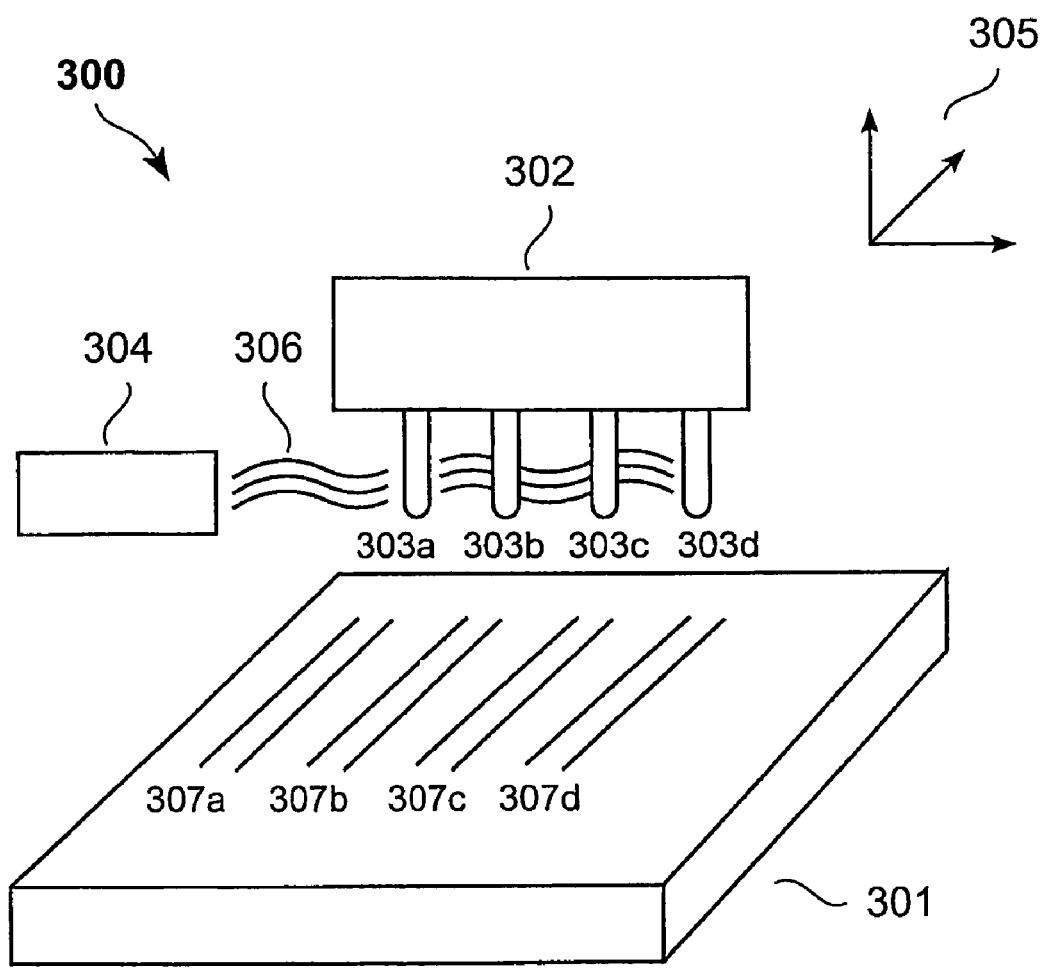
FIG. 3 shows a device for patterning structures on a substrate according to another embodiment of the present invention.

In FIG. 3 is shown a schematic illustration of a device 300 for patterning structures, e.g. for depositing conductor lines, with small dimensions onto a substrate 301 according to another embodiment of the present invention. Comparing to device 200 shown in FIG. 2, the device 300 in FIG. 3 comprises an AFM 302 having several tips 303a, 303b, 303c and 303d. The number of four is not to be taken in a limiting sense. According to the present invention other desired and suitable number of tips, for example two(2) or six(6), may be used.

The device 300 comprises the AFM 302, which is only schematically shown. The AFM 302 comprises a plurality of metalized tips 303a, 303b, 303c and 303d. In the embodiment of FIG. 3 the tips 303a, 303b, 303c and 303d are gold tips having a diameter of 5 nm, but the tips can be made of every other material suitable for AFM tips. Underneath the tips 303a, 303b, 303c and 303d a substrate 301 may be arranged on which lines, e.g. conductor lines, may be formed. Further, the device 300 comprises a laser 304 which may illuminate the tips 303a, 303b, 303c and 303d with a laser beam of a low intensity, i.e. an intensity which is not high enough to decompose a vapour or gas which is introduced between the tips 303a, 303b, 303c and 303d and the substrate 301. The AFM 302 and thus the tips 303a, 303b, 303c and 303d of the AFM and/or the substrate 301 can be three-dimensionally moved which is indicated by the coordinate system 305 shown in FIG. 3.

For the patterning of the substrate 301 the above-mentioned device 300 is inserted into a common Chemical Vapour Deposition apparatus (CVD apparatus) as described in reference to FIG. 2 and which is also not shown in FIG. 3.

During patterning the substrate 301 a primary laser beam 306 is emitted by the laser 304 which illuminates the tips 303a, 303b, 303c and 303d while a gas or a vapour suitable for CVD is introduced into a space between the tips 303a, 303b, 303c and 303d and the substrate 201. In the embodiment of FIG. 3 $AuClPF_3$ is used as the gas introduced into the space between the tips 303a, 303b, 303c and 303d and the substrate 301. The threshold temperature for decomposition of $AuClPF_3$ is about 150° Celsius. As the laser device 304, i.e. laser source, a weak infrared source can be used, such as a sapphire laser emitting light having a wavelength of 810 nm. As already mentioned the intensity, i.e. energy of said primary laser beam 306 is not high enough to decompose said gas or vapour so that no deposition of metal lines, i.e. conductor lines, would be possible by the primary laser beam.

As mentioned with reference to FIG. 1 the primary laser beam 306 is amplified by the tips 303a, 303b, 303c and 303d of the AFM 302 so that the intensity, i.e. energy of the electromagnetic near field in the close vicinity of the tips 303a, 303b, 303c and 303d is high enough to decompose said gas or vapour so that a CVD can be accomplish forming metal lines 307a, 307b, 307c and 307d on the substrate 301. That is the temperature in close vicinity to the tip is increased above 150° Celsius and thus the $AuClPF_3$ is decomposed. This results in the deposition of gold on the substrate, while the AFM tip is scanning the substrate. Since the electromagnetic field is only strong enough to decompose said vapour in close vicinity of the tips 303a, 303b, 303c and 303d the metal lines 307a, 307b, 307c and 307d having very small dimensions can be formed on the substrate 301. By using tips 303a, 303b, 303c and 303d having a diameter of 5 nm metal lines 307a, 307b, 307c and 307d having the same dimension, i.e. a dimension of 5 nm, can be formed onto the substrate 301. A typical distance between the tips 303a, 303b, 303c and 303d and the substrate 301 is in the range of 5 to 10 nm.

By using a device 300 according to FIG. 3 a plurality of parallel metal lines may be formed on the substrate 301 by a single step. Thus, the efficiency of the device and the method for patterning a substrate may be increased.

Summarizing, one aspect of the invention may be seen in using an Atomic Force Microscope (AFM) together with a weak laser beam for forming sub-lithographic structures on a substrate. A weak laser beam of a laser device is emitted onto a metalized tip of the AFM. Instead of an AFM, a Scanning Tunnel Microscope (STM) can be used as well. By projecting the weak primary laser beam onto the tip of the AFM an electromagnetic field around said tip is amplified to such an extend that a provided gas, which is suitable for Chemical Vapour Deposition (CVD), is decomposed and a component of the decomposed gas is deposited onto the substrate.

Advantages of the present invention over the prior art are the following. The amplification is only done in the near field, i.e. few nanometers around the metalized tip, so that the gas is only decomposed in the close vicinity to the tip and thus also the deposition of the decomposed gas is only done in the close vicinity of the tip. Thus, structures, e.g. metal lines, with dimensions of a few nanometers can be formed on the substrate. With a tip having a diameter of 5 nm and a distance between the tip and the substrate of 5 to 10 nm lines with a dimension of 5 nm can be achieved. Such dimensions are suitable for molecular microelectronic. However the diameter of the tip is not limited to 5 nm, but can be of any suitable diameter. Preferably the diameter of the tip corresponds to the desired dimensions of the lines, e.g. in case of a desired line dimension of 10 nm, i.e. a line width of 10 nm, the diameter of the tip can be about 10 nm.

Another advantage is that the formed structures on the substrate can easily be found, since a scanning of the substrate and the forming of the lines on the substrate is done at the same time. This is possible since the tips is excited by an external laser beam instead of a strong electric field in the tip as in the methods according to the prior art. According to the present invention no strong electric field is used and thus the lifespan of the tip is increased, compared to the prior art according which such a strong electric field is applied which wears out the tip quite fast.

Another advantage is that chemical reactions like decomposition are only present at the tip where the intensity and such the energy is high enough, thus leading to a less aggressive environment around the substrate and the AFM.

Although the present invention and its advantages have been described in detail, it should be understood that various changes, substitutions and alterations can be made herein without departing from the spirit and scope of the invention as defined in the appended claims.

What is claimed is:

1. A method for patterning structures on a substrate, comprising:
   providing a substrate underneath a tip of an Atomic Force Microscope;
   providing a vapour of a material, which is suitable for Chemical Vapour Deposition onto the substrate when decomposed, in a space between the tip and the substrate; and exposing the tip to a light beam emitted by a light emitting device in such a way that the tip intensifies an electromagnetic near-field created through a surface Plasmon resonance to such an extent that the vapour is decomposed, wherein an intensity of the light beam at the tip of the Atomic Force Microscope is not enough to decompose the vapour.

2. A method according to claim 1, wherein providing said vapour comprises providing a gas selected from a group consisting of Halides, Hydrides, Metal Organic Compounds, $AuClPF_3$, $W(CO)_6$, $TiCl_4$, $TaCl_5$, $WF_6$, $SiH_4$, $GeH_4$, $AlH_3(NMe_3)_2$, $NH_3$, $Ti(CH_2tBu)_4$, $Ti(OiPr)_4$, $Ti(NMe_2)_4$, $Cu(acac)_2$, and $Ni(CO)_4$.

3. A method according to claim 1, wherein exposing said tip to said light beam comprises emitting said light beam onto said tip in such a way that a polarization of said light beam is parallel to a longitudinal axis of said tip.

4. A method according to claim 1, further comprising adapting a wavelength of said light beam to match the size of said tip such that a sufficient amplification of said light beam is achieved.

5. A method according to claim 1, further comprising applying a laser to emit said light beam and exposing said tip to said light beam.

6. A method according to claim 1, wherein said Atomic Force Microscope has multiple tips, further comprising providing said substrate underneath said multiple tips.

7. A method according to claim 6, further comprising metalizing one or more of said multiple tips.

\* \* \* \* \*